United States Patent
Masenas

(10) Patent No.: US 7,453,296 B2
(45) Date of Patent: *Nov. 18, 2008

(54) DELAY LOCKED LOOP HAVING CHARGE PUMP GAIN INDEPENDENT OF OPERATING FREQUENCY

(75) Inventor: Charles J. Masenas, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 11/854,042

(22) Filed: Sep. 12, 2007

(65) Prior Publication Data

US 2008/0054962 A1 Mar. 6, 2008

Related U.S. Application Data

(63) Continuation of application No. 11/279,446, filed on Apr. 12, 2006, now Pat. No. 7,301,380.

(51) Int. Cl.
*H03L 7/06* (2006.01)

(52) U.S. Cl. ............... 327/158; 327/536; 327/537; 327/390; 307/110; 363/59

(58) Field of Classification Search ......... 327/155–158, 327/536, 537, 589, 390, 391; 307/110; 363/59, 363/60

See application file for complete search history.

(56) References Cited

U.S. PATENT DOCUMENTS

| | | |
|---|---|---|
| 4,636,748 A | 1/1987 | Latham, II et al. |
| 5,410,263 A | 4/1995 | Walzman |
| 5,589,802 A | 12/1996 | O'Shaughnessy et al. |
| 5,594,388 A | 1/1997 | O'Shaughnessy et al. |
| 5,614,855 A | 3/1997 | Lee et al. |
| 5,646,563 A | 7/1997 | Kuo |
| 5,724,007 A | 3/1998 | Mar |
| 5,727,037 A | 3/1998 | Maneatis |
| 5,729,163 A | 3/1998 | McCleary et al. |
| 5,874,847 A | 2/1999 | Kim et al. |
| 5,912,575 A | 6/1999 | Takikawa |
| 6,011,440 A | 1/2000 | Bell et al. |
| 6,169,458 B1* | 1/2001 | Shenoy et al. ............. 331/17 |
| 6,285,725 B1 | 9/2001 | Sung et al. |
| 6,330,296 B1 | 12/2001 | Atallah et al. |
| 6,392,456 B1 | 5/2002 | Pyeon et al. |

(Continued)

OTHER PUBLICATIONS

Masenas, U.S. Appl. No. 11/854,046, BUR920050279US3, Office Action Communication, Jul. 9, 2008, 16 pages.

*Primary Examiner*—N. Drew Richards
*Assistant Examiner*—An T. Luu
(74) *Attorney, Agent, or Firm*—Michael J. LeStrange; Hoffman Warnick LLC

(57) ABSTRACT

A delay locked loop (DLL) having a charge pump gain independent of the operating frequency of the DLL. A method for providing a constant gain for a charge pump component of a delay locked loop (DLL) is disclosed, and includes: providing a switched capacitor stage responsive to a charge phase for charging a capacitor and a dump phase for dumping the capacitor; and aligning the charge phase and the dump phase such that a control voltage provided by the charge pump is independent of a frequency of a DLL charge and discharge phase.

4 Claims, 6 Drawing Sheets

U.S. PATENT DOCUMENTS

| | | |
|---|---|---|
| 6,400,211 B1 | 6/2002 | Yokomizo et al. |
| 6,535,051 B2 | 3/2003 | Kim |
| 6,538,491 B1 | 3/2003 | Spanoche |
| 6,597,218 B1 | 7/2003 | Gauthier et al. |
| 6,642,759 B1 | 11/2003 | Hughes |
| 6,727,735 B2 | 4/2004 | Park |
| 6,784,707 B2 | 8/2004 | Kim et al. |
| 6,825,730 B1 * | 11/2004 | Sun .............................. 331/16 |
| 6,847,251 B2 * | 1/2005 | Kao ............................ 327/536 |
| 6,980,046 B2 | 12/2005 | Soe |
| 7,034,588 B2 | 4/2006 | Cheung et al. |
| 2003/0155950 A1 | 8/2003 | van der Valk et al. |
| 2003/0215041 A1 | 11/2003 | Gauthier et al. |
| 2004/0008063 A1 | 1/2004 | Kim et al. |
| 2004/0017241 A1 | 1/2004 | Saeki |
| 2005/0052208 A1 | 3/2005 | Starr |

* cited by examiner

US 7,453,296 B2

DELAY LOCKED LOOP HAVING CHARGE PUMP GAIN INDEPENDENT OF OPERATING FREQUENCY

This continuation application claims priority to patent application "DELAY LOCKED LOOP HAVING CHARGE PUMP GAIN INDEPENDENT OF OPERATING FREQUENCY," Ser. No. 11/279,446, filed on Apr. 12, 2006, now U.S. Pat. No. 7,301,380 the contents of which are hereby incorporated by reference.

FIELD OF THE INVENTION

The invention relates generally to delay locked loops (DLLs), and more particularly relates to a DLL that utilizes a switched capacitor circuit as a charge pump to eliminate the dependence of the magnitude of the control voltage steps on cycle time.

BACKGROUND OF THE INVENTION

A delay locked loop (DLL) is a commonly used circuit for synchronizing clocks. A DLL works by inserting delay between an input clock and a feedback clock until the two rising edges align, putting the two clocks 360° out of phase (meaning they are in phase but delayed by exactly one clock cycle time). After the edges from the input clock line up with the edges from the feedback clock, the DLL "locks." As long as the circuit is not evaluated until after the DLL locks, the two clocks have no discernible difference in phase.

DLLs typically comprise a phase detector (e.g., XOR, latch, etc.), a charge pump, a capacitor, and voltage controlled delay line. Typically, the types of phase detectors employed are current sources that are "on" for all or part of the duration of the cycle time. FIG. 1 depicts a prior art example of a DLL 10 having a delay chain 12 that receives an input clock (iclk) and generates an output clock (clk). The output clock (clk) and a reference clock signal (refclk) are inputs to a phase detector (PD) 14, which in turn controls a charge pump 16 that charges or discharges a capacitive load 18, depending upon whether the output clock (clk) is lagging or leading the reference clock (refclk).

Note that phase detector 14 is a clocked latch whose output is a digital signal valid for a full clock cycle. This type of signal created by this circuit, referred to as a "bang-bang" control signal type, has constant amplitude and a direction dependent on the polarity of the phase error (in contrast to a linear control signal where the phase detector produces a signal proportional to the phase error). Charge pump 16 is a push-pull current source that injects a current into a capacitive load 18 for the duration of a clock cycle. The charge pump current polarity is either positive (charging) or negative (discharging) into the load. As the period of the clock signal becomes longer (lower frequency), the magnitude of the voltage swings on the control node of the voltage controlled delay line Vc becomes larger, and consequently, more jitter is produced on the output of delay chain 12. In other words, the charge being loaded onto the control voltage Vc is proportional to the cycle time of the DLL.

Since DLLs typically are required to operate over a wide frequency range (typically a ratio of 2 to 1), it is important to minimize jitter over the entire frequency range. Accordingly, a need exists for an enhanced DLL circuit that can minimize jitter, particularly for processing low frequency clock periods.

SUMMARY OF THE INVENTION

The present invention addresses the above-mentioned problems, as well as others, by providing a DLL that utilizes a switched capacitor circuit as a charge pump to completely eliminate the dependence of control voltage steps on cycle time. Separate clock phases are developed to control the capacitor switching.

In a first aspect, the invention provides a delay locked loop (DLL) circuit having a charge pump gain independent of frequency, comprising: a switched capacitor charge pump configured with an "H" driver output stage; a phase detector; a capacitor; and a voltage controlled delay line.

In a second aspect, the invention provides a method of controlling a charge pump gain from a charge pump to a voltage controlled delay line in a delay locked loop (DLL) circuit, comprising: generating a charge signal and a dump signal during each period of a reference clock signal; charging a first capacitor and a second capacitor in response to the charge signal; dumping a positive charge from the first capacitor and a negative charge from the second capacitor to an output stage of the charge pump in response to the dump signal; and selectively loading either the positive charge or the negative charge to a capacitive element on the voltage controlled delay line in response to an input signal from a phase detector.

In a third aspect, the invention provides an integrated circuit having a delay locked loop (DLL) that includes a charge pump for providing a charge to a capacitive element on a voltage controlled delay line of the DLL, wherein the charge is independent of a cycle time of the DLL, and wherein the charge pump comprises: a charge/dump signal generation stage that generates a charge signal and a dump signal during each period of a reference clock signal; a first switched capacitor stage that charges a first capacitor in response to the charge signal and dumps a positive charge from the first capacitor in response to the dump signal; a second switched capacitor stage that charges a second capacitor in response to the charge signal and dumps a negative charge from the second capacitor in response to the dump signal; and an output stage that selectively loads either the positive charge or the negative charge to the capacitive element on the voltage controlled delay line in response to an input signal from a phase detector.

In a fourth aspect, the invention provides a method for providing a constant gain for a charge pump component of a delay locked loop (DLL), the method comprising: providing a switched capacitor stage responsive to a charge phase for charging a capacitor and a dump phase for dumping the capacitor; and aligning the charge phase and the dump phase such that a control voltage provided by the charge pump is independent of a frequency of a DLL charge and discharge phase.

In a fifth aspect, the invention provides delay locked loop (DLL) having a charge pump that comprises: an "H" driver output stage; a first switched capacitor stage for dumping a predetermined positive charge into the "H" driver output stage from a first capacitor during each period of a reference clock; and a second switched capacitor stage for dumping a predetermined negative charge into the "H" driver output stage from a second capacitor during each period of the reference clock.

Advantages of this circuit include: less jitter compared to a current source charge pump; no need for a separate current reference circuit (e.g., band gap) and associated wiring between the current reference and the charge pumps in applications having several DLLs; and a constant charge pump gain with manufacturing process variations due to excellent integrated circuit process tracking between switched capacitor source and capacitor load.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

Figure 1:
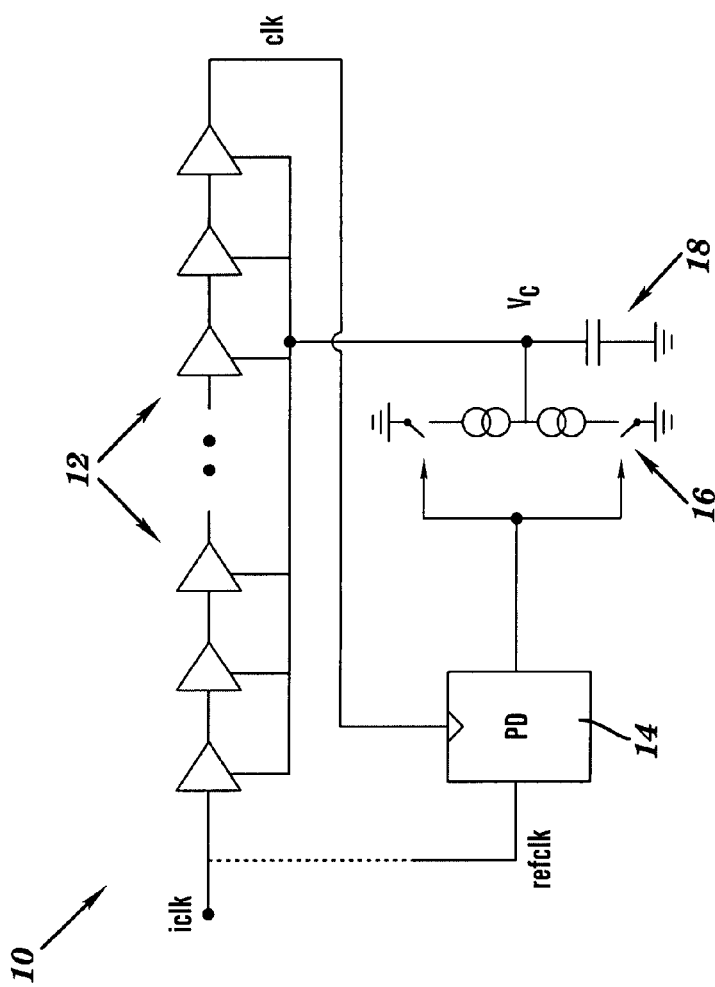
FIG. 1 depicts a prior art DLL circuit.
Figure 2:
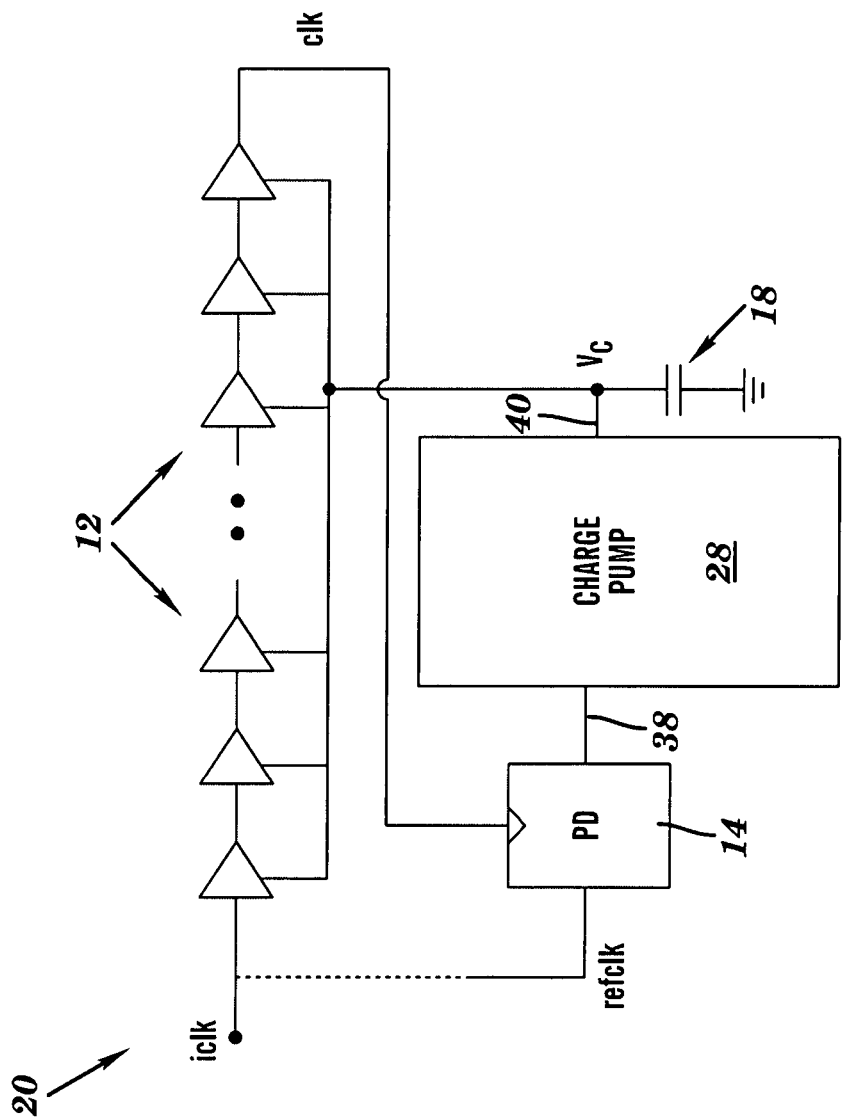
FIG. 2 depicts a DLL circuit having a switched capacitor charge pump circuit in accordance with an embodiment of the present invention.

FIG. 2 depicts a delay locked loop (DLL) circuit 20 that is similar in implementation to the prior art circuit shown in FIG. 1, with the exception that DLL circuit 20 includes a switched capacitor charge pump 28 that provides a charge that is independent of the cycle time of the DLL. Switched capacitor charge pump 28 includes an input 38 coupled to an output of phase detector (PD) 14, and an output 40 coupled to a capacitive load 18 that resides on a voltage control delay line Vc.

Figure 3:
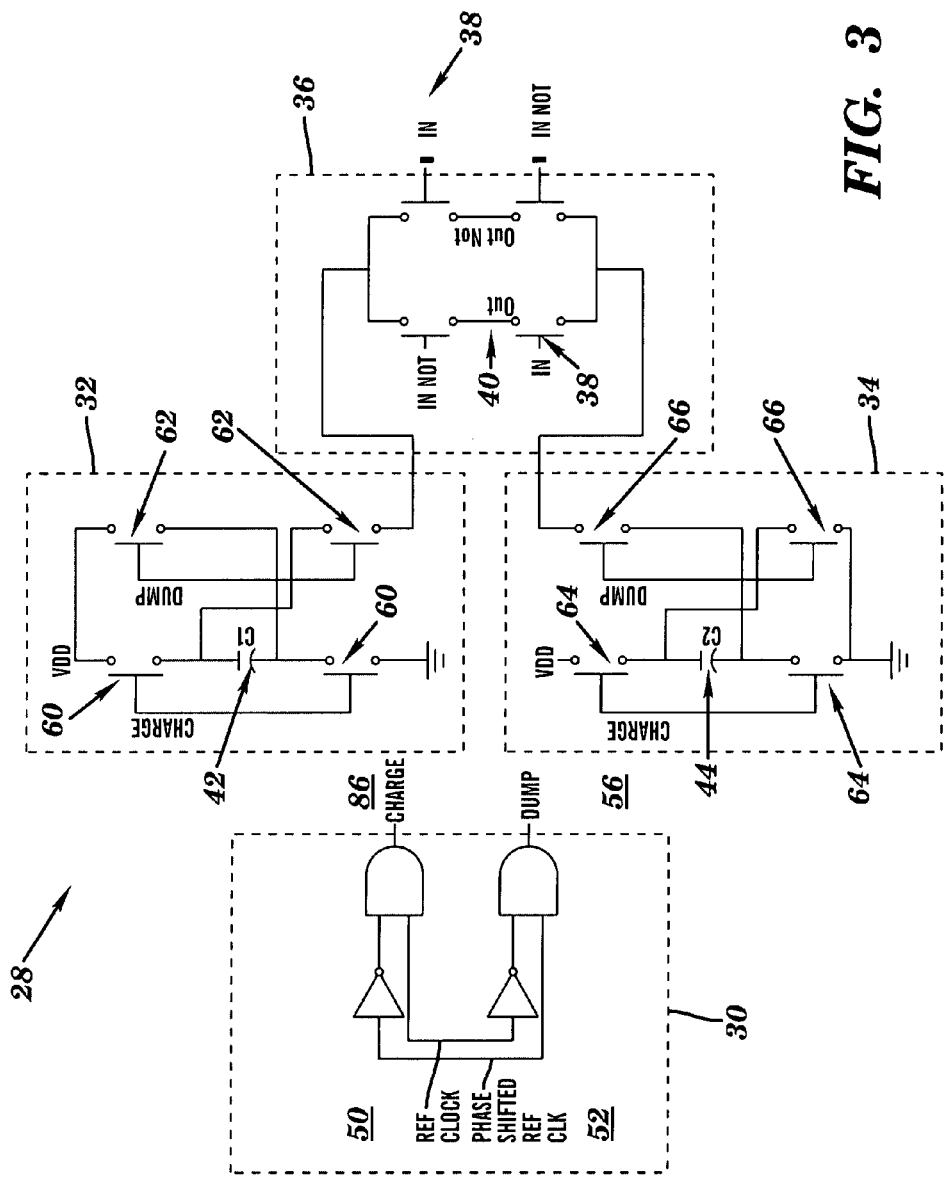
FIG. 3 depicts a switched capacitor charge pump circuit in accordance with an embodiment of the present invention.

FIG. 3 depicts a schematic diagram of an illustrative switched capacitor charge pump 28 that includes: a charge/dump signal generation stage 30; a pair of switched capacitor stages 32, 24; and output stage 36.

Figure 4:
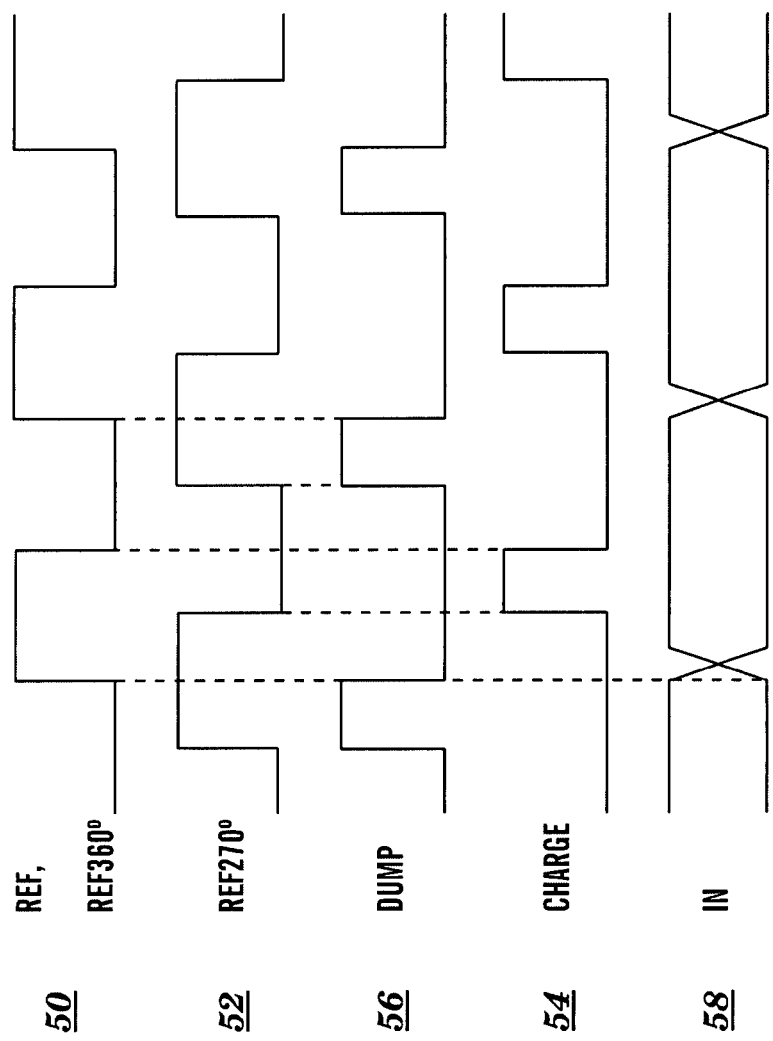
FIG. 4 depicts wave form diagram showing the charge and dump signals in accordance with an embodiment of the present invention.

Charge/dump signal generation stage 30 takes as input a reference clock 50 and a phase shifted reference clock 52 and outputs a charge signal 54 and dump signal 56 during each period of reference clock 50. FIG. 4 illustrates a wave form diagram for creating charge signal 54 and dump signal 56. The diagram of FIG. 4 includes reference clock 50, a 270 degree phase shifted reference clock 52, dump signal 56 and charge signal 54. The width and timing of the dump signal 56 is defined by the leading edge of the 270 degree phase shifted reference clock 52 and the leading edge of reference clock 50. The width and timing of charge signal 54 is defined by the trailing edge of the 270 degree phase shifted reference clock 52 and the trailing edge of reference clock 50. Dump and charge signals 56, 54 are timed so as not to interfere with any transient input signals received in the charge pump output stage 36 (FIG. 3), which is shown as IN signal 58 in the waveform diagram. The charge and dump phases are aligned so that the latch outputs of the phase detector latch are resolved well before the dump phase is initiated. This timing resolves the charge direction before the switched capacitors are dumped. This timing occurs because signal IN 58 is the output of a latch having signal Ref360 as the clock input. Since Ref360 nominally has the same phase as reference clock 50 (Ref), signal IN 58 will change state when clock 50 (Ref) changes state. It is evident from FIG. 4 that this timing ensures that IN 58 is resolved (does not change state) during the dump cycle. Alternatively, IN 58 can also be resolved at the time of the falling edge of clock 50 (Ref) by changing the polarities of the latch and latch input.

Returning to FIG. 3, the charge pump output stage 36, which is referred to as an "H" driver configuration, includes both input node 38 (IN) and output node 40 (OUT) of the charge pump 28. The particular "H" driver configuration includes a pair of opposed In/In Not nodes, an Out node and an Out Not node. The Out Not node may be used to control one side of a capacitor in a differential voltage controlled system, but in the present embodiment it will be tied to a constant voltage source. This arrangement minimizes glitching of output node 40 during switching transients. In a single ended implementation, Out Not node can be tied to a constant voltage approximately equal to the voltage of Out, i.e., output node 40. Output stage 36 is coupled to a first switched capacitor stage 32 having a first switched capacitor 42 (C1) and a second switched capacitor stage 34 having a second switched capacitor 44 (C2).

Switched capacitors 42, 44 are each charged and dumped once per cycle in response to charge 54 and dump 56 signals generated by charge/dump signal generation stage 30. Switched capacitor stage 32 is configured to dump a positive charge, and switched capacitor stage 34 is configured to dump a negative charge. The respective charges stored on switched capacitors 42, 44 are injected into either the Out or the Out Not node depending on the state of input node IN 38. The state of input node IN 38 is a digital signal that is the output of phase detector 28 (FIG. 2). Thus, for instance, if the state of input node IN 38 is high, then the negative charge from switched capacitor 44 will be dumped to output node Out 40 and the positive charge from switched capacitor 42 will be dumped to Out Not. Conversely, if the state of input node IN 38 is low, then the positive charge from switched capacitor 42 will be dumped to output node Out 40 and the negative charge from switched capacitor 44 will be dumped to Out Not.

Switched capacitor stage 32 includes: a first pair of switches 60 that connect switched capacitor 42 (C1) to VDD and ground, which causes switched capacitor 42 (C1) to be charged when a charge signal 54 is received from the charge/dump signal generation stage 30; and a second pair of switches 62 that cause the charge stored on switched capacitor 42 (C1) to be dumped into output stage 36. Similarly, switched capacitor stage 34 includes: a first pair of switches 64 that connect switched capacitor 44 (C2) to VDD and ground, and causes switched capacitor 44 (C2) to be charged when a charge signal 54 is received from the charge/dump signal generation stage 30; and a second pair of switches 66 that cause a negative charge stored on switched capacitor 44 (C2) to be dumped into output stage 36. Accordingly, output stage 36 will always receive a predetermined constant charge. During the charge phase, switched capacitors 42 (C1) and 44 (C2) are each charged to a voltage of +VDD. During the dump phase, the voltage on switched capacitor 42 (C1) will be $V_{OUT}$–VDD (where $V_{OUT}$ is the voltage of node Out 40) and the voltage on switched capacitor 44 (C2) will be $-V_{OUT}$. Assuming that the voltage $V_{OUT}$ is VDD/2, the net change in voltage for each capacitor that is dumped into Out 40 is thus 1.5*VDD during each clock cycle, regardless of the clock period.

Figure 5:
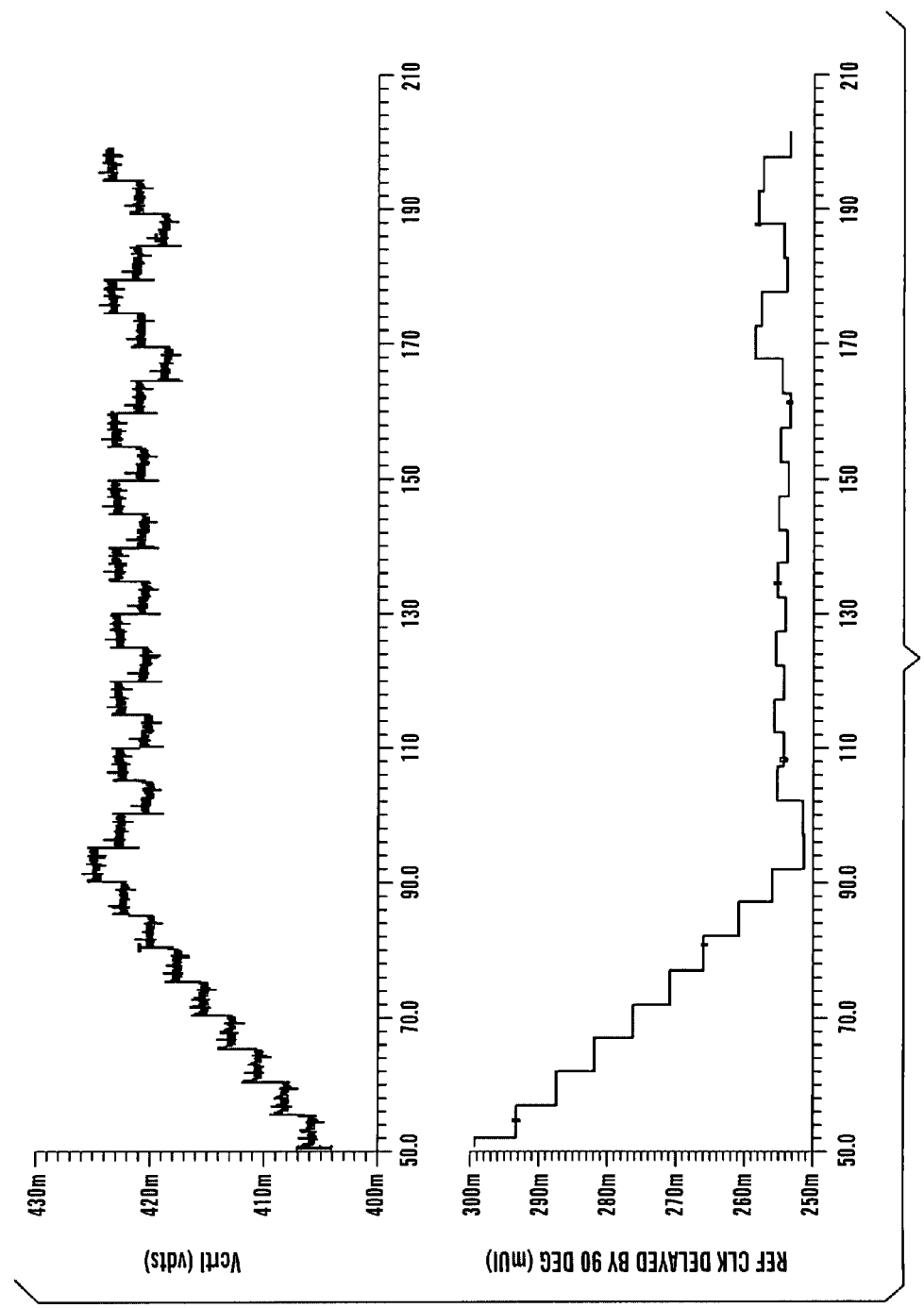
FIG. 5 depicts resulting experimental graphs for a DLL having a switched capacitor charge pump circuit in accordance with an embodiment of the present invention.

FIG. 5 depicts experimental results generated using a switched capacitor charge pump 28 such as that described above. The top trace depicts the voltage on the storage capacitor Vc as a function of time, while the bottom trace depicts the phase in milli-unit intervals (mUI) of the output of delay line that is 90 degrees out of phase with the input clock 50. As can be seen in the bottom trace, the signal stabilizes at about 250 mUI, which indicates good performance (250 mUI=90 degrees).

Figure 6:
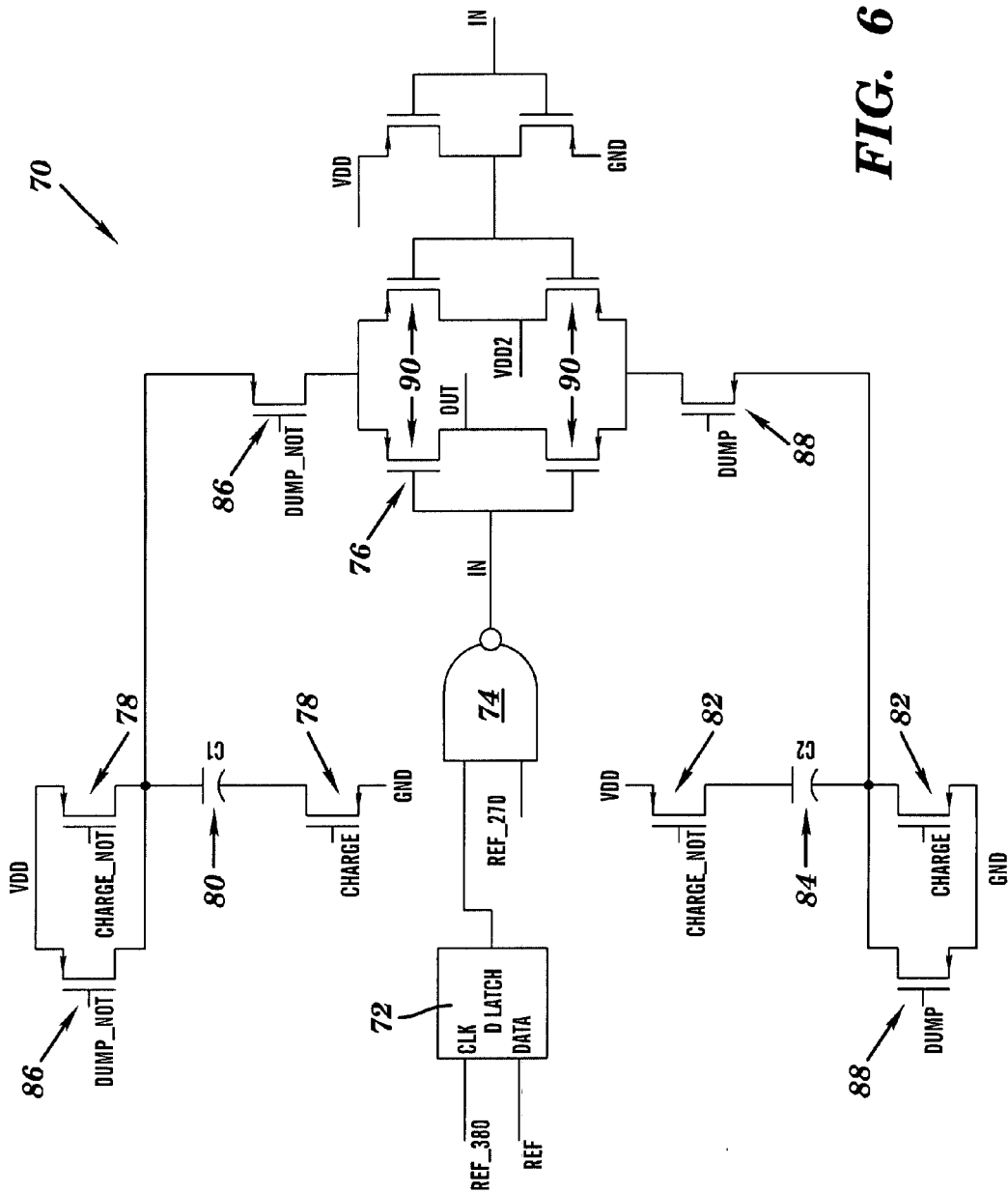
FIG. 6 depicts an integrated circuit implementation of a switched capacitor charge pump circuit using FETs in accordance with an embodiment the present invention.

FIG. 6 depicts an integrated circuit implementation 70 of a switched capacitor charge pump 28 that utilizes FETs to control the switching operations. As shown, NAND gate 74 resides between phase latch detector 72 and an H-driver 76. NAND gate 74 ensures locking of the DLL, and is also necessary to initialize the DLL by charging capacitive load 18 (see FIG. 2) to VDD before the circuit is turned on.

In addition, integrated circuit implementation 70 includes: a first set of charge FETs 78, which when activated cause capacitor 80 to charge; a second set of charge FETs 82, which when activated cause capacitor 84 to charge; a first set of dump FETs 86, which when activated cause a positive charge to be dumped from capacitor 80; a second set of dump FETs 88, which when activated cause a positive charge to be dumped from capacitor 84; and the H-driver 76 configuration that includes opposed pairs of FETs 90.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for providing a constant gain for a charge pump component of a delay locked loop (DLL), the method comprising:
   providing a switched capacitor stage responsive to a charge phase for charging a capacitor and a dump phase for dumping the capacitor; and
   aligning the charge phase and the dump phase such that a control voltage provided by the charge pump is independent of a frequency of a DLL charge and discharge phase.

2. The method of claim 1, wherein the charge phase and the dump phase are generated during each period of a clock associated with the DLL.

3. The method of claim 1, wherein an output signal of a phase detector latch of the DLL is resolved before the dump phase is initiated.

4. The method of claim 3, wherein the phase detector latch is clocked by a clock signal having substantially the same phase as a reference clock for the DLL.

* * * * *